(12) United States Patent
Acar et al.

(10) Patent No.: US 12,315,995 B2
(45) Date of Patent: May 27, 2025

(54) GROUNDING ASSEMBLY FOR A SEMICONDUCTOR DEVICE

(71) Applicant: NXP B.V., Eindhoven (NL)

(72) Inventors: Mustafa Acar, Eindhoven (NL); Philipp Franz Freidl, Weurt (NL); Antonius Hendrikus Jozef Kamphuis, Nijmegen (NL); Jan Willem Bergman, Veghel (NL); Rajesh Mandamparambil, Eindhoven (NL)

(73) Assignee: NXP B.V., Eindhoven (NL)

( * ) Notice: Subject to any disclaimer, the term of this patent is extended or adjusted under 35 U.S.C. 154(b) by 468 days.

(21) Appl. No.: 17/664,089

(22) Filed: May 19, 2022

(65) Prior Publication Data

US 2022/0384943 A1 Dec. 1, 2022

(30) Foreign Application Priority Data

May 25, 2021 (EP) .................................. 21175806

(51) Int. Cl.
| | | |
|---|---|---|
| *H01Q 1/48* | (2006.01) | |
| *H01Q 1/22* | (2006.01) | |
| *H01Q 1/52* | (2006.01) | |
| *H01Q 9/04* | (2006.01) | |
| *H01Q 21/00* | (2006.01) | |
| *H01Q 23/00* | (2006.01) | |

(52) U.S. Cl.
CPC ............ *H01Q 1/48* (2013.01); *H01Q 1/2283* (2013.01); *H01Q 1/526* (2013.01); *H01Q 9/0414* (2013.01); *H01Q 21/0087* (2013.01); *H01Q 23/00* (2013.01)

(58) Field of Classification Search
CPC ........... H01L 2223/6677; H01L 23/552; H01L 23/66; H01Q 1/2283; H01Q 1/48; H01Q 1/526; H01Q 21/0087; H01Q 21/065; H01Q 23/00; H01Q 9/0414
See application file for complete search history.

(56) References Cited

U.S. PATENT DOCUMENTS

| | | | | |
|---|---|---|---|---|
| 5,216,435 | A * | 6/1993 | Hirata | H01Q 1/3275 343/705 |
| 10,096,558 | B1 | 10/2018 | Chiang et al. | |
| 2017/0084356 | A1 | 3/2017 | Gonya et al. | |
| 2020/0075503 | A1 | 3/2020 | Chuang et al. | |
| 2020/0212596 | A1* | 7/2020 | Chen | H01Q 21/065 |
| 2020/0313305 | A1* | 10/2020 | Yang | H01Q 21/065 |

(Continued)

OTHER PUBLICATIONS

Choi, Jinwoo et al; "Methodology for Minimizing Far-End Noise Coupling between Interconnects in High-Speed Ceramic Modules"; IEEE Electronic Components and Technology Conference; 7 pages (2009).

(Continued)

*Primary Examiner* — Thien M Le

(57) ABSTRACT

A semiconductor device may include an antenna array and a grounding assembly configured to at least partially electrically shield the antenna array. The grounding assembly may include a first grounding layer comprising a first plurality of openings and a second grounding layer comprising a second plurality of openings. The second grounding layer may at least partially occlude the first plurality of openings of the first grounding layer when viewed from above the antenna array.

16 Claims, 4 Drawing Sheets

(56) References Cited

U.S. PATENT DOCUMENTS

| | | |
|---|---|---|
| 2021/0021024 A1 | 1/2021 | Park et al. |
| 2021/0026428 A1* | 1/2021 | Olarig .................... G06F 1/206 |
| 2021/0185809 A1* | 6/2021 | Park .................... H05K 1/0225 |
| 2023/0019425 A1* | 1/2023 | Yong ...................... H01Q 1/364 |
| 2023/0198164 A1* | 6/2023 | Park ........................ H02J 50/23 |
| | | 343/848 |
| 2024/0136718 A1* | 4/2024 | Evtyushkin .......... H01Q 9/0435 |
| 2024/0388008 A1* | 11/2024 | Wei ...................... H01Q 21/062 |

OTHER PUBLICATIONS

Saeidi-Manesh, H. et al; "Challenges and Limitations of the Cross-Polarization Suppression in Dual-Polarization Antenna Arrays Using Identical Subarrays"; IEEE Trans. on Antennas and Propagation, vol. 68, No. 4; pp. 2853-2866 (Apr. 2020).

Salter, Martin et al, NPL/Astrium; "Impact of Meshed Ground Planes on the Electromagnetic Behaviour of Printed Circuit Boards"; 5th EMPPS Workshop, ESA/ESTEC, May 20-22, 2014; 43 pages.

\* cited by examiner

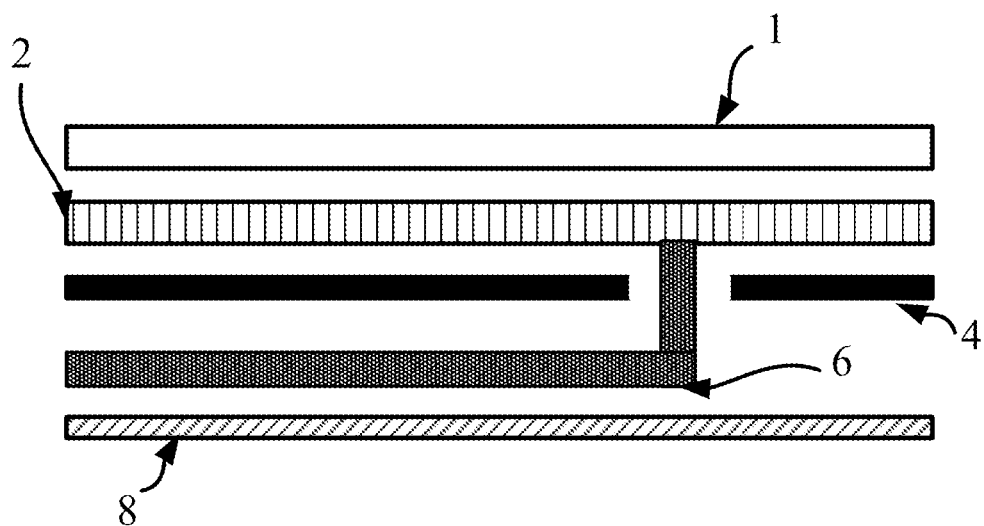
FIG. 1 – PRIOR ART
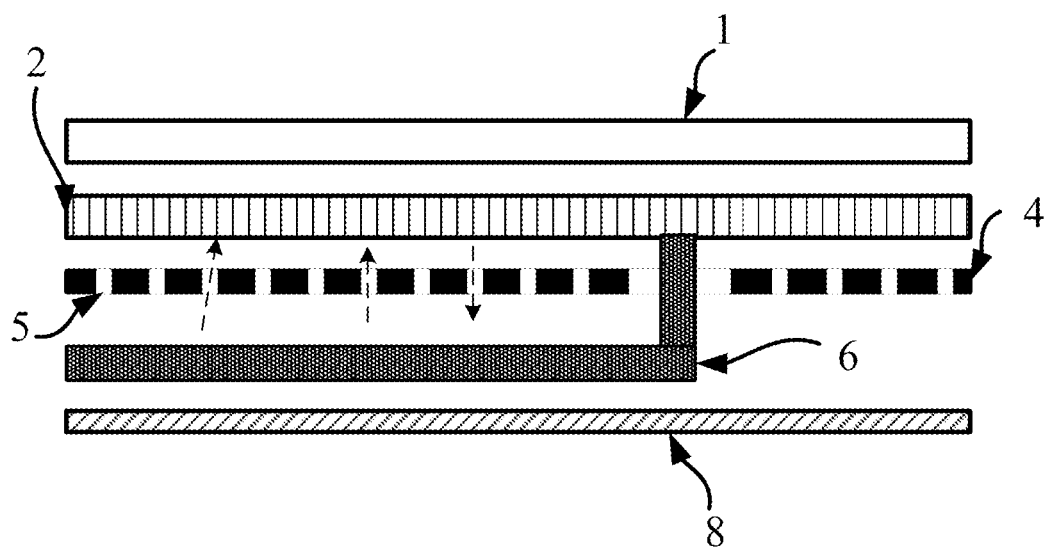
FIG. 2 – PRIOR ART

GROUNDING ASSEMBLY FOR A SEMICONDUCTOR DEVICE

CROSS-REFERENCE TO RELATED APPLICATIONS

This application claims the priority under 35 U.S.C. § 119 of European patent application no. 21175806.5, filed May 25, 2021 the contents of which are incorporated by reference herein.

BACKGROUND

The present specification relates to grounding assemblies for electrically shielding a component in a semiconductor device.

Many components of semiconductor devices, such as antenna arrays, require electrical shielding to improve performance and ensure sufficient isolation between different components. Electrical shielding is typically provided by a grounding assembly in the semiconductor device which absorbs or reflects stray electromagnetic (EM) signals.

Ideally, the grounding assembly completely shields or isolates the component (e.g., the antenna array) from all unwanted EM signals. To try to achieve this, it is known to use a solid grounding plane, as shown in FIG. 1 of the drawings. However, many semiconductor fabrication technologies prohibit large solid metal areas due to warpage, reliability, yield, and feature resolution reasons.

U.S. Pat. No. 10,096,558 B1 describes a multi-band antenna package structure including a shielding layer, a manufacturing method thereof and communication device.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising an antenna array and a grounding assembly configured to at least partially electrically shield the antenna array. The grounding assembly comprises a first grounding layer comprising a first plurality of openings, and a second grounding layer comprising a second plurality of openings, wherein the second grounding layer at least partially occludes the first plurality of openings of the first grounding layer when viewed from above the antenna array.

Thus, the second grounding layer at least partially blocks the first plurality of openings of the first grounding layer when viewed from above the antenna array.

It will be appreciated that 'when viewed from above the antenna array' means when viewed from a direction parallel to a surface normal of the antenna array.

In other words, the second grounding layer at least partially occludes the first plurality of openings of the first grounding layer when viewed from a direction perpendicular to the surface of the antenna array.

The first grounding layer may comprise solid walls surrounding the first plurality of openings, and the second grounding layer may comprise solid walls surrounding the second plurality of openings, wherein the solid walls of the second grounding layer at least partially block the first plurality of openings.

Optionally, the first grounding layer is electrically coupled to the second grounding layer. For example, the first grounding layer may be electrically coupled to the second grounding layer by one or more vias.

Optionally, the first grounding layer comprises or consists of a mesh, or a metallic mesh.

Optionally, the second grounding layer comprises or consists of a mesh, or a metallic mesh.

Optionally, the first grounding layer and the second grounding layer are arranged in a stack. In other words, the first grounding layer may be arranged or stacked above the second grounding layer.

Optionally, the first plurality of openings are offset with respect to the second plurality of openings when viewed from above the antenna array.

Optionally, the second grounding layer completely occludes the first plurality of openings when viewed from above the antenna array.

Optionally, the first plurality of openings each have a different size and/or shape relative to the second plurality of openings.

In some embodiments, each of the first plurality of openings may have the same size and shape as each of the second plurality of openings. The second plurality of openings may be offset from the first plurality of openings, such that the second plurality of openings are not aligned with the first plurality of openings.

Optionally, at least one conductor extends from the antenna array through the first grounding layer and the second grounding layer, wherein the at least one conductor is electrically isolated from the grounding assembly. In some embodiments, the at least one conductor may be a transmission line, or strip line conductor.

The grounding assembly may further comprise a third grounding layer comprising a third plurality of openings. The third grounding layer may at least partially occlude the second plurality of openings of the second grounding layer when viewed from above the antenna array.

The third grounding layer may at least partially occlude the first plurality of openings of the first grounding layer when viewed from above the antenna array.

Optionally, the third plurality of openings are offset with respect to the second plurality of openings and the first plurality of openings when viewed from above the antenna array.

Optionally, the third grounding layer may completely occlude the second plurality of openings, when viewed from above the antenna array.

Optionally, the semiconductor device may comprise an integrated circuit package. It will be appreciated that 'package' and 'integrated circuit package' may be used interchangeably throughout this disclosure.

The grounding assembly may be provided in the integrated circuit package. The antenna array may be mounted to, or contained in, the integrated circuit package.

Thus, the package may be an antenna-in-package (AiP) package or a launcher-in-package (LiP) package. The package may be an antenna-on-package (AoP) package, or the antenna array may be attached to the package as a package-on-package (PoP). In some embodiments, the antenna array may be provided externally to the package.

Optionally, the antenna array may be a phased antenna array. Optionally, the antenna array may comprise a patch antenna array.

In a further aspect, the present disclosure provides a method of manufacturing a semiconductor device, comprising providing an antenna array and at least partially electrically shielding the antenna array by providing a grounding assembly. Providing a grounding assembly comprises providing a first grounding layer comprising a first plurality of openings, and providing a second grounding layer comprising a second plurality of openings, wherein the second grounding layer at least partially occludes the first plurality of openings of the first grounding layer when viewed from above the antenna array.

The method may include providing a third grounding layer comprising a third plurality of openings, wherein the third grounding layer at least partially occludes the second plurality of openings when viewed from above the antenna array.

The method may be any a method of manufacturing a semiconductor device according to any embodiment or example of the present disclosure.

Optionally, the semiconductor device may comprise an integrated circuit package.

The method may include encasing the grounding assembly in the integrated circuit package.

Optionally, the method may include mounting the antenna array on or to the package.

Optionally, the method may include encasing the antenna array in the package.

It will be appreciated that the die may be as defined in any above example or embodiment of the disclosure.

BRIEF DESCRIPTION OF THE DRAWINGS

Illustrative embodiments of this disclosure will be described hereinafter, by way of example only, with reference to the accompanying drawings in which like reference signs relate to like elements and in which:

FIG. 1—shows a prior art example of a semiconductor device comprising a grounding assembly;

FIG. 2—shows another prior art example of a semiconductor device comprising a grounding assembly;

DETAILED DESCRIPTION

Figure 3:
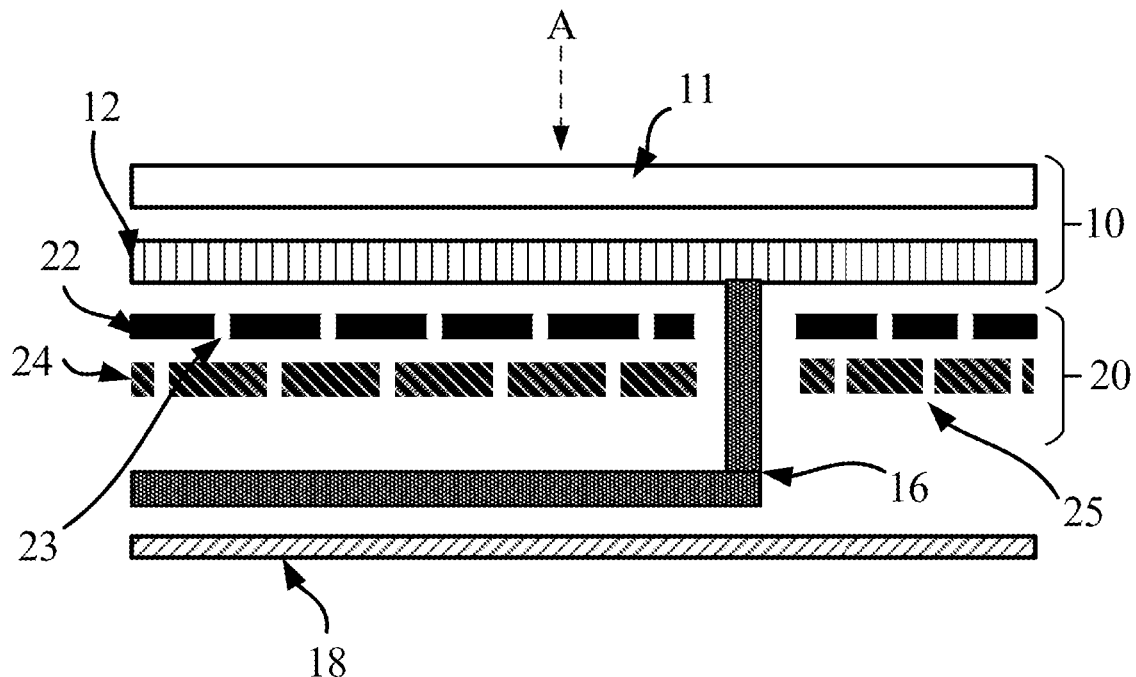
FIG. 3—shows a semiconductor device according to an embodiment of this disclosure.

Embodiments of this disclosure are described in the following with reference to the accompanying drawings.

A prior art example of a semiconductor device is shown in FIG. 1. This is a schematic representation of a cross-sectional view through part of a semiconductor device. The semiconductor device comprises an antenna array formed of a first patch antenna 1 and a second patch antenna 2. In other embodiments, different types of antenna array may be provided. Although the present disclosure is primarily concerned with semiconductors comprising antenna arrays, it will be appreciated that many passive electromagnetic components require grounding and could be provided instead of an antenna array.

A grounding plane 4 is provided to electrically shield the antenna array 1, 2. The grounding plane 4 is a solid metal layer that absorbs or reflects electromagnetic (EM) signals and prevents the EM signals interfering with the performance of the antenna array 1, 2. A conductor 6, such as a strip line conductor, is coupled to the antenna array 2. The conductor 6 extends through an opening in the grounding plane 4, such that the conductor 6 is electrically isolated from the grounding plane 4. The conductor 6 may run parallel to a further layer 8 in the semiconductor device.

Whilst the grounding plane 4 in FIG. 1 provides high-quality electrical shielding, the large surface area of the solid metal layer can lead to warpage of the semiconductor device, and other fabrication problems such as reduced reliability, yield, and feature resolution.

As an alternative to providing a solid grounding plane, it is known to provide a meshed grounding plane, as shown in FIG. 2. Instead of a solid or continuous metal layer as in FIG. 1, the grounding plane 4 in FIG. 2 comprises a plurality of openings 5. For example, the grounding plane 4 may be a mesh or a grid. The openings 5 address the fabrication problems associated with a solid grounding plane 4 but provide reduced electrical isolation that can decrease performance of the antenna array 1, 2. This is because the openings 5 can allow EM signals to pass through, as illustrated by the dotted arrows in FIG. 2.

There is therefore a need for an improved grounding assembly that addresses the fabrication and reliability problems associated with a solid grounding plane, whilst still providing effective, high-quality electrical shielding. High-quality electrical shielding means that a high proportion of EM signals are blocked and prevented from interfering with the antenna array.

An embodiment of a semiconductor device according to this disclosure is shown in FIG. 3. This is a schematic representation of a cross-sectional view through part of a semiconductor device. The semiconductor device comprises an antenna array 10. In this embodiment the antenna array 10 comprises a first patch antenna 11 and a second patch antenna 12. It will be appreciated that any suitable type of antenna array 10 may be provided.

A grounding assembly 20 is provided to electrically shield the antenna array 10. The grounding assembly 20 comprises a first grounding layer 22 and a second grounding layer 24. A conductor 16, such as a strip line conductor, extends from the antenna array 10 through an opening in the grounding assembly 20. The conductor 16 is electrically isolated from the grounding assembly 20. The conductor 16 may extend parallel to another layer 18 in the semiconductor device.

The first grounding layer 22 is stacked above the second grounding layer 24. The first grounding layer 22 comprises a first plurality of openings 23 and the second grounding layer 24 comprises a second plurality of openings 25. Thus, both the first and second grounding layers 22, 24 are meshed grounding planes.

As shown in FIG. 3, when viewed from above the antenna array 10 (e.g., along direction A indicated by the dotted arrow, parallel to the surface normal), the second grounding layer 24 at least partially occludes the first plurality of openings 23. In other words, the solid portions of the second grounding layer 24 at least partially block or obscure the first plurality of openings 23 of the first grounding layer 22, when viewed along direction A.

Equivalently, when viewed from above the antenna array 10, the first grounding layer 22 at least partially occludes the second plurality of openings 25.

The first plurality of openings 23 are offset from the second plurality of openings 25 when viewed from above the antenna array 10. In some embodiments, the first plurality of openings 23 may be the same size and shape as the second plurality of openings 25. In other embodiments, the first plurality of openings 23 may be a different size and/or shape compared to the second plurality of openings 25.

The grounding assembly 20 of FIG. 3 reduces warpage and other fabrication problems associated with solid grounding planes, whilst also providing higher-quality electrical shielding compared to a single meshed grounding plane as shown in FIG. 2. This is because at least a portion of the EM signals that manage to pass through the second plurality of openings 25 will be blocked by the first grounding layer 22, and at least a portion of the EM signals that manage to pass through the first plurality of openings 23 will be blocked by the second grounding layer 24. Thus, performance of the antenna array 10 may be increased, by reducing EM interference and improving electrical isolation of the antenna array 10.

Although FIG. 3 shows that the second ground layer 24 completely occludes the first plurality of openings 23, this is not essential.

Figure 4:
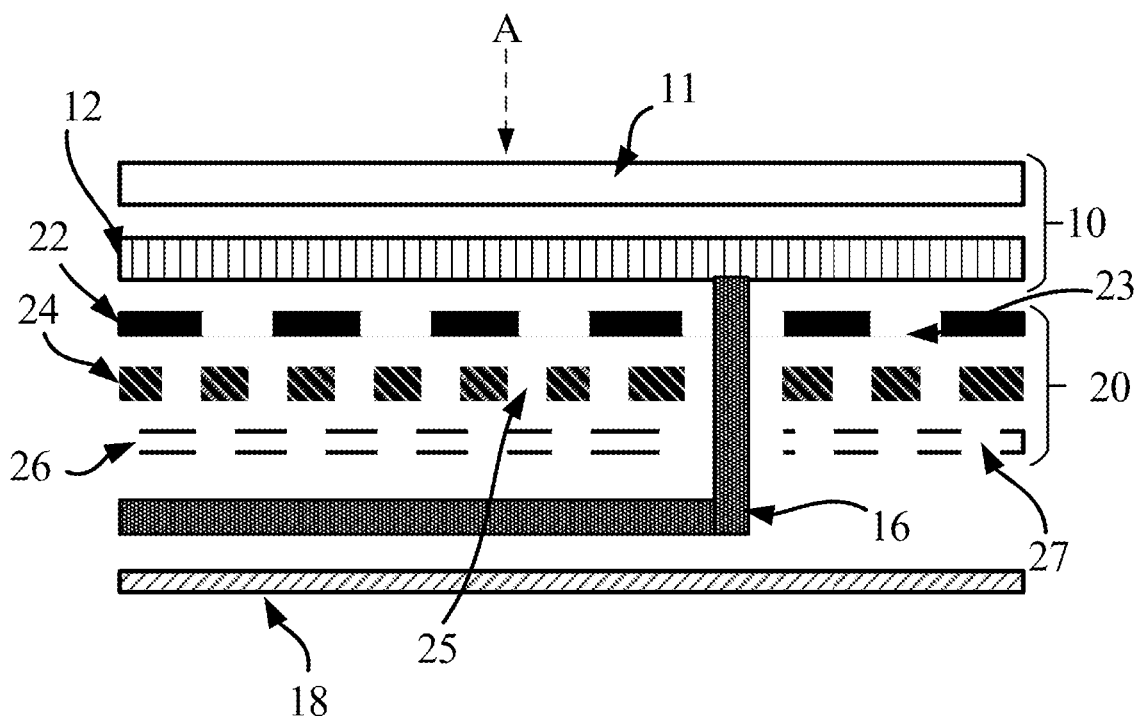
FIG. 4—shows a semiconductor device according to another embodiment of this disclosure.

In FIG. 4, the second grounding layer 24 only partially occludes the first plurality of openings 23 when viewed from above the antenna array (e.g., along direction A parallel to the surface normal). Equivalently, the first grounding layer 22 only partially occludes the second plurality of openings 25 when viewed from above the antenna array. This means that some EM signals may be able to pass through both the first openings 23 and the second openings 25.

In FIG. 4 the grounding assembly 20 comprises an additional third grounding layer 26. The third grounding layer 26 comprises a third plurality of openings 27. The third grounding layer 26 at least partially occludes the second plurality of openings 25, when viewed along direction A. Providing the third grounding layer 26 may further improve performance of the antenna array 10, but this will increase manufacturing costs. It will be appreciated that in some embodiments more than three grounding layers may be provided.

The semiconductor device shown in FIGS. 3 and 4 may comprise or consist of an integrated circuit package. In some embodiments, the grounding assembly 20 may be encased in the package. The antenna array 10 may be mounted to the package or encased in the package. Thus, the package may be an antenna-in-package (AiP) package, or a launcher-in-package (LiP) package, or an antenna-on-package (AoP) package. Alternatively, the antenna array 10 may be attached to the package as a package-on-package (PoP).

The first, second and third grounding layers 22, 24, 26 may be any type of mesh or metallic layer comprising through-holes. It be appreciated that the size, shape, and layout of the openings can be varied.

Figure 5:
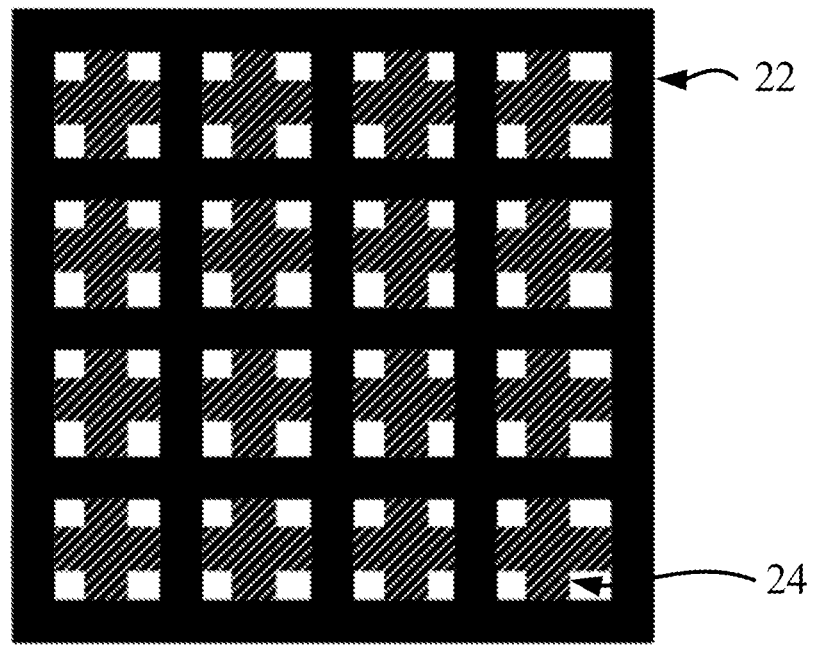
FIG. 5—shows a schematic plan view of a first grounding layer and a second grounding layer according to an embodiment of this disclosure.

FIG. 5 shows a plan view (e.g., from above the antenna array or along direction A in FIG. 3 or 4) of a grounding assembly 20 according to an embodiment of this disclosure. The first grounding layer 22 is a grid having a plurality of square or rectangular openings. The second grounding layer 24 is also a grid having a plurality of square or rectangular openings, wherein the openings in the second grounding layer 24 are offset relative to the first grounding layer 22. As shown, the second grounding layer 24 partially occludes the openings of the first grounding layer 22 when viewed from above the antenna array.

Figure 6:
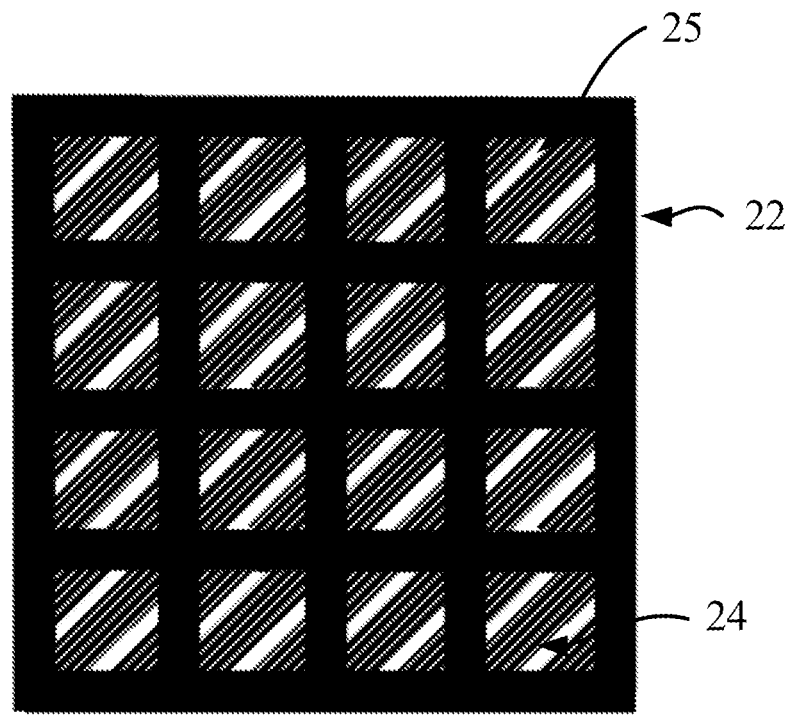
FIG. 6—shows a schematic plan view of a first grounding layer and a second grounding layer according to another embodiment of this disclosure.

In FIG. 6, the first grounding layer 22 is as shown in FIG. 5, but the second grounding layer 24 is different. Instead of a grid, the second grounding layer 24 comprises a plurality of diagonal strip openings 25. The solid portions of the second grounding layer 24 partially occlude the square openings of the first grounding layer 22.

Figure 7:
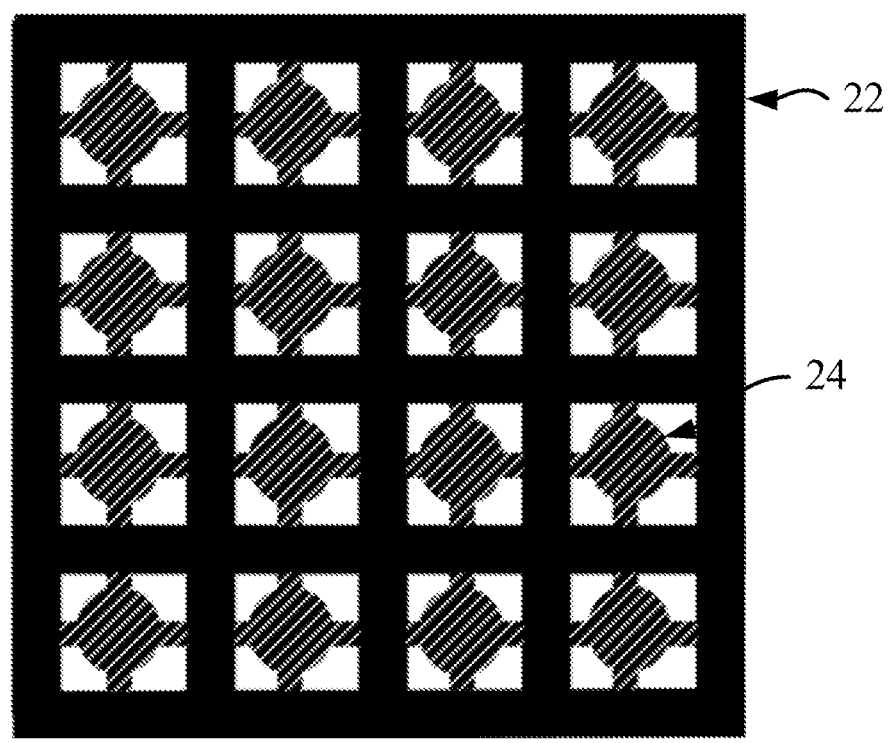
FIG. 7—shows a schematic plan view of a first grounding layer and a second grounding layer according to another embodiment of this disclosure.

In FIG. 7, the first grounding layer 22 is as shown in FIGS. 5 and 6, but the second grounding layer 24 is different. The second grounding layer 24 comprises a mesh or grid wherein a solid circular portion is aligned with the center of each of the openings in the first grounding layer 22. For simplicity, only two grounding layers are shown in FIGS. 5 to 7.

In some embodiments, the first grounding layer 22 and the second grounding layer 24 may be swapped in FIGS. 5 to 7. In other words, the first grounding layer 22 may take the shape of the second grounding layer 24 shown in FIGS. 5 to 7.

It will be appreciated that the grounding layers can take any shape and are not limited to the specific embodiments shown in FIGS. 5 to 7.

Accordingly, there has been described a semiconductor device comprising an antenna array and a grounding assembly configured to at least partially electrically shield the antenna array. The grounding assembly comprises a first grounding layer comprising a first plurality of openings and a second grounding layer comprising a second plurality of openings, wherein the second grounding layer at least partially occludes the first plurality of openings of the first grounding layer when viewed from above the antenna array.

Thus, the present disclosure provides an improved grounding assembly for electrically shielding an antenna array in a semiconductor device, wherein the grounding assembly comprises multiple meshed grounding planes. This has the benefit of reducing warpage and fabrication problems that arise when using a solid grounding plane, whilst providing improved electrically shielding compared to known meshed grounding assemblies.

Although particular embodiments of this disclosure have been described, it will be appreciated that many modifications/additions and/or substitutions may be made within the scope of the claims.

The invention claimed is:

1. A semiconductor device comprising:
   an antenna array; and
   a grounding assembly configured to at least partially electrically shield the antenna array, wherein the grounding assembly comprises:
   a first grounding layer comprising a first plurality of openings; and
   a second grounding layer comprising a second plurality of openings, wherein the second grounding layer at least partially occludes the first plurality of openings of the first grounding layer when viewed from above the antenna array, and wherein the first plurality of openings each have a different size and/or shape relative to the second plurality of openings.

2. The semiconductor device of claim 1, wherein the first grounding layer comprises solid walls surrounding the first plurality of openings, and the second grounding layer comprises solid walls surrounding the second plurality of openings, wherein the solid walls of the second grounding layer at least partially block the first plurality of openings.

3. The semiconductor device of claim 1, wherein the first grounding layer is electrically coupled to the second grounding layer.

4. The semiconductor device of claim 1, wherein at least one of the first grounding layer and the second grounding layer comprise a mesh.

5. The semiconductor device of claim 1, wherein the first grounding layer and the second grounding layer are arranged in a stack.

6. The semiconductor device of claim 1, wherein the first plurality of openings are offset with respect to the second plurality of openings when viewed from above the antenna array.

7. The semiconductor device of claim 1, wherein the second grounding layer completely occludes the first plurality of openings when viewed from above the antenna array.

8. The semiconductor device of claim 1, further comprising at least one conductor extending from the antenna array through the first grounding layer and the second grounding layer, wherein the at least one conductor is electrically isolated from the grounding assembly.

9. The semiconductor device of claim 1, wherein the grounding assembly further comprises:
a third grounding layer comprising a third plurality of openings, wherein the third grounding layer at least partially occludes the second plurality of openings of the second grounding layer when viewed from above the antenna array.

10. The semiconductor device of claim 9, wherein the third plurality of openings are offset with respect to the second plurality of openings and the first plurality of openings when viewed from above the antenna array.

11. The semiconductor device of claim 1, further comprising an integrated circuit package, wherein the grounding assembly is provided in the integrated circuit package and the antenna array is mounted to, or provided in, the integrated circuit package.

12. The semiconductor device of claim 1, wherein the antenna array is a patch antenna array.

13. A semiconductor device comprising:
an antenna array; and
a grounding assembly configured to at least partially electrically shield the antenna array, wherein the grounding assembly comprises:
a first grounding layer comprising a first plurality of openings; and
a second grounding layer comprising a second plurality of openings, wherein the first grounding layer at least partially blocks the second plurality of openings of the second grounding layer when viewed from a direction parallel to a surface normal of the antenna array, and wherein the first plurality of openings are offset with respect to the second plurality of openings when viewed from a direction parallel to a surface normal of the antenna array.

14. The semiconductor device of claim 13, further comprising an integrated circuit package, wherein the grounding assembly is provided in the integrated circuit package and the antenna array is mounted to, or provided in, the integrated circuit package.

15. The semiconductor device of claim 13, further comprising providing a third grounding layer comprising a third plurality of openings, wherein the third grounding layer at least partially blocks the second plurality of openings when viewed from a direction parallel to a surface normal of the antenna array.

16. A semiconductor device comprising:
an antenna array;
a grounding assembly configured to at least partially electrically shield the antenna array, wherein the grounding assembly comprises:
a first grounding layer comprising a first plurality of openings; and
a second grounding layer comprising a second plurality of openings, wherein the second grounding layer at least partially occludes the first plurality of openings of the first grounding layer when viewed from above the antenna array, and
at least one conductor extending from the antenna array through the first grounding layer and the second grounding layer, wherein the at least one conductor is electrically isolated from the grounding assembly.

* * * * *